(12) United States Patent
Phillips, Jr.

(10) Patent No.: US 6,483,400 B1
(45) Date of Patent: Nov. 19, 2002

(54) PASSIVE LOW PASS LC FILTER WITH COUNTER-WOUND COILS

(75) Inventor: William Thomas Phillips, Jr., Boardman, OH (US)

(73) Assignee: Delphi Technologies, Inc., Troy, MI (US)

( * ) Notice: Subject to any disclaimer, the term of this patent is extended or adjusted under 35 U.S.C. 154(b) by 1 day.

(21) Appl. No.: 09/698,953

(22) Filed: Oct. 27, 2000

(51) Int. Cl.[7] .................................................. H03H 7/01
(52) U.S. Cl. ......................... 333/185; 336/232; 333/175
(58) Field of Search ................................ 333/184, 185, 333/175; 336/232

(56) References Cited

U.S. PATENT DOCUMENTS

| | | | | |
|---|---|---|---|---|
| 5,532,656 A | * | 7/1996 | Yoshimura | 333/185 |
| 5,602,517 A | * | 2/1997 | Kaneko et al. | 333/185 |
| 5,618,777 A | * | 4/1997 | Hey-Shipton et al. | 333/185 |
| 5,977,845 A | * | 11/1999 | Kitahara | 333/184 |

* cited by examiner

*Primary Examiner*—Justin P. Bettendorf
(74) *Attorney, Agent, or Firm*—Thomas N. Twomey

(57) ABSTRACT

A passive low pass filter of a surface mounted device configuration has counter-wound coils and at least one capacitor. Each coil has a centerline. The centerlines are parallel to one-another and perpendicular to a plurality of plates of the capacitor. The windings of the coils and the plates of the capacitor are encased in a dielectric encapsulant.

11 Claims, 4 Drawing Sheets

PASSIVE LOW PASS LC FILTER WITH COUNTER-WOUND COILS

TECHNICAL FIELD

This invention related to a passive low pass filter and more particularly to a passive low pass filter of a surface mount device configuration.

BACKGROUND OF THE INVENTION

Low pass filters are used in computer, communications, and automotive industries. Currently, discrete components such as ferrite block and surface mounted device capacitors are used as low pass filters to reduce noise generated by nearby electrical components. The filters reduce noise by passing electrical signals having frequencies within a specified filter pass band and attenuating noise induced frequencies that lie outside the pass band.

The passive low pass filter is a circuit essentially behaving as a frequency sensitive voltage divider. At high frequencies the output behaves as if it is shorted while at low frequencies the output appears as an open circuit. Passive low pass filters comprise one or more inductances and compacitences tuned to suppress or attenuate the unwanted signals while allowing passage of a band of wanted signals. A typical low pass filter has an inductor, a capacitor and a dielectric encapsulant. The encapsulant commonly encases the filter and engages to and separates a plurality of plates which comprise the capacitor. A variety of low pass filters of a surface mount configuration exist, they include a T-filter, a LC-filter and a π-filter.

The consumer markets for low pass filters are requiring greater frequency attenuation utilizing smaller components. As attenuation increases, noise becomes a greater problem. The magnetic field of the inductor, otherwise known as a coil, may produce a form of noise known as eddy currents across the capacitor plates.

SUMMARY OF THE INVENTION

The invention provides a passive low pass filter of a surface mounted device configuration. The filter comprises two coils, each wound about their own parallel centerlines. The coils are preferably counter-wound to enhance the flux linkage between the windings of the coil, thereby, increasing the inductance of the coil. Each coil is in electrical contact with at least one capacitor. Each capacitor has a plurality of hot plates and at least one ground plate. Each one of the ground plates alternate between each one of the hot plates. The ground and hot plates are generally perpendicular to the centerlines. Separating the ground plates from the hotplates is a dielectric encapsulant which also encases the coils. Preferably, the coils generate a magnetic field parallel to ground conductor plates and end conductor plates mounted externally to the encapsulant and generally perpendicular to the capacitor plates. This orientation eliminates the problem of induced eddy currents at the ground and end conductor plate locations.

Preferably, the low pass filter is of a π-type configuration wherein the coils are disposed between a first and a second capacitor. The plurality of hotplates of each capacitor have a feed plate connecting to a bottom winding of each coil. Top windings for the first and second coils of the π-type configuration are directly connected.

Thus, an advantage of the present invention is a reduced size.

Another advantage of the present invention is an inductance increase.

Yet another advantage of the present invention is the elimination of eddy currents.

BRIEF DESCRIPTION OF THE DRAWINGS

The presently preferred embodiment of the invention is disclosed in the following description and the accompanying drawings, wherein.

DETAILED DESCRIPTION OF THE PREFERRED EMBODIMENTS

Figure 1:
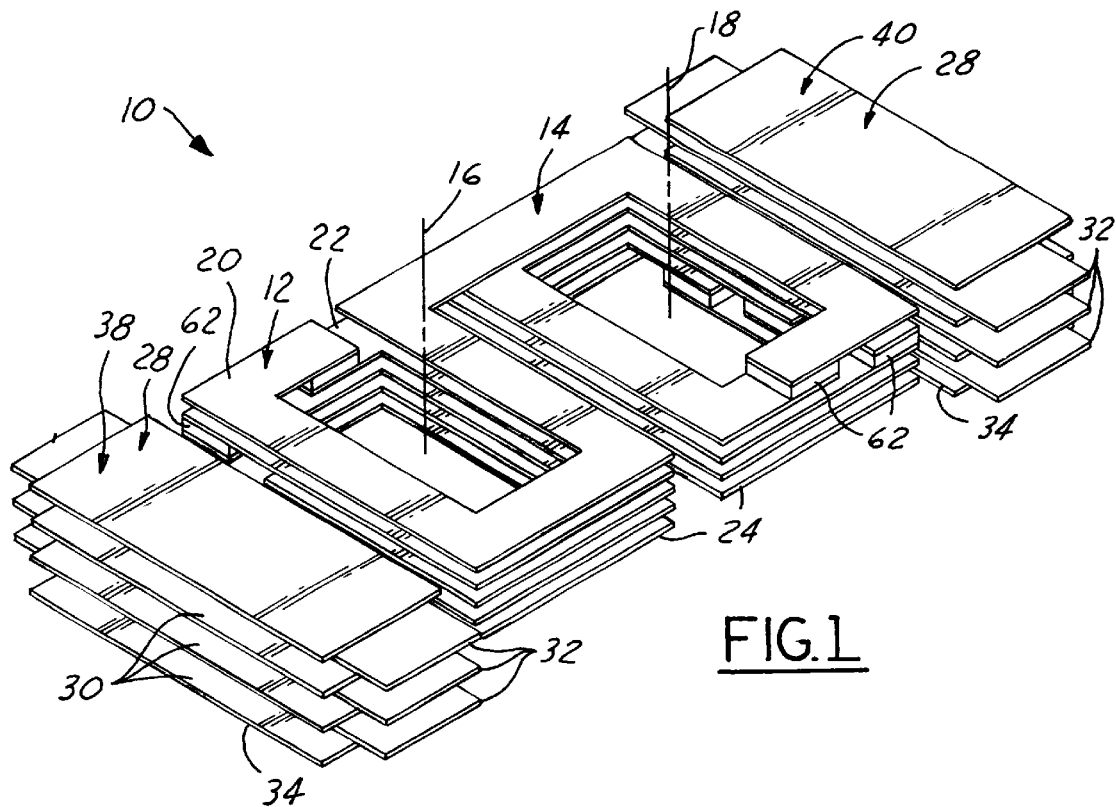
FIG. 1 is a perspective view of a π-type passive low pass filter of the invention with a dielectric encapsulant and surface conductor plates removed to show internal detail.

Referring to FIG. 1, a passive low pass filter 10 is shown having a first coil 12 and a second coil 14. The coils 12, 14 have parallel centerlines 16, 18, respectively. Each coil 12, 14 has a top winding 20 connecting to intermediate windings 22, in turn, connecting to a bottom winding 24. The windings 20, 22, 24 of coils 12, 14 wind about centerlines 16, 18 respectively. First coil 12 and second coil 14 interconnect electrically.

Figure 2:
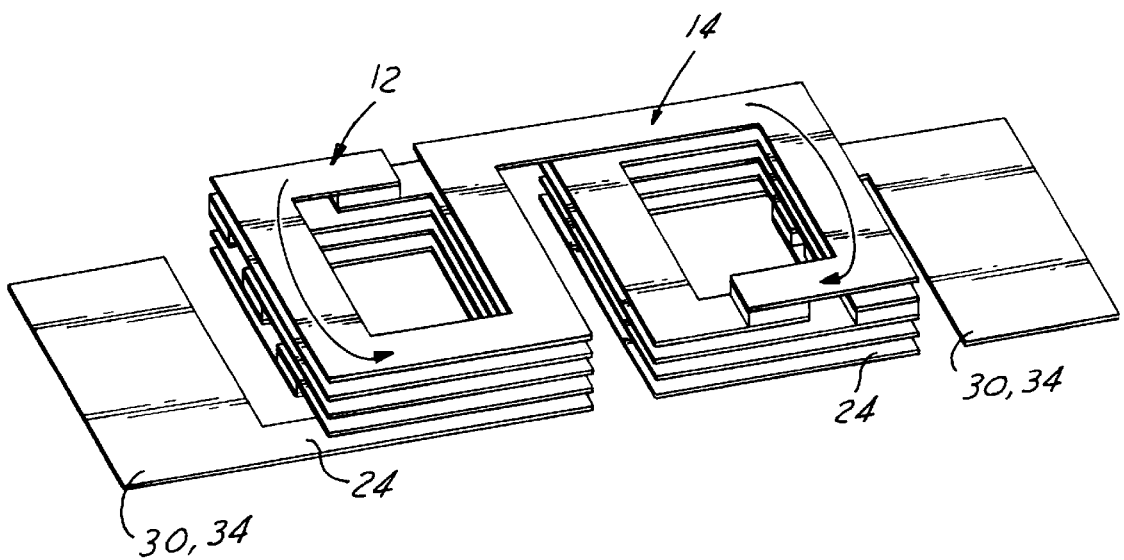
FIG. 2 is a partial perspective view of the π-type passive low pass filter of FIG. 1.
Figure 3:
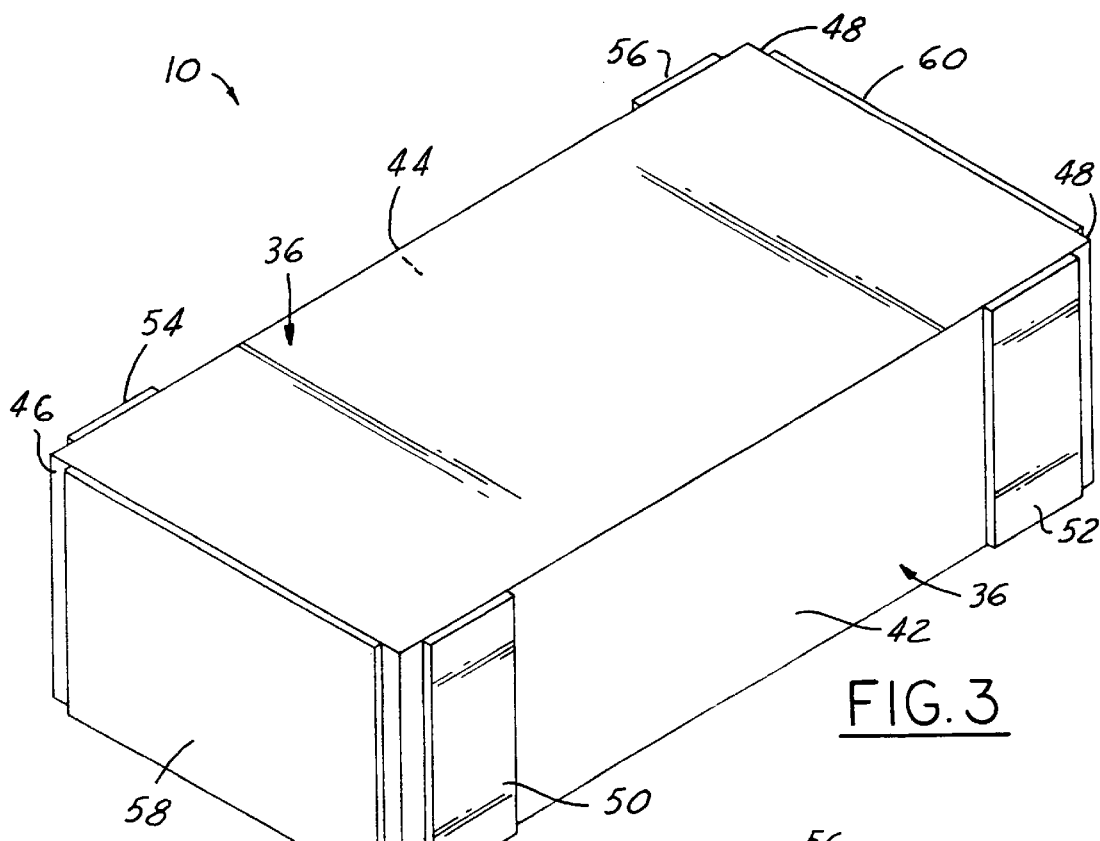
FIG. 3 is a perspective view of the π-type passive low pass filter.

Adjacent to the first and second coils 12, 14 is at least one capacitor 28. Each capacitor 28 has a plurality of hot plates 30 and at least one ground plate 32. The greater the number of plates, the greater the capacitance. Hot and ground plates 30, 32 are substantially perpendicular to the centerlines 16, 18. Each hot plate 30 and each ground plate 32 stack alternately in the upward direction preferably beginning with a feed plate 34 of the plurality of hot plates 30. Referring to FIG. 2, the feed plate 34 connects electrically to the bottom winding 24 of the adjacent coil 12 or coil 14. As best shown in FIG. 3, a dielectric encapsulant 36, preferably made of barium titanate, separates the hot and ground plates 30, 32 and encases coils 12, 14. The first 12 and the second coil 14 counter-wind to enhance the flux linkage between the windings of the coils 12, 14, thus increasing the inductance.

Referring to FIGS. 1 and 2, a π-type of the passive low pass filter 10 is illustrated. The top windings 20 of the coils 12, 14 of the π-type embodiment directly connect electrically. The capacitors 28 preferably comprise of a first capacitor 38 and a second capacitor 40. The coils 12, 14 are positioned between the first and second capacitors 38, 40. The bottom windings 24 of coils 12, 14 connect electrically to feed plates 34 of the first and second capacitors 38, 40, respectively.

Figure 4:
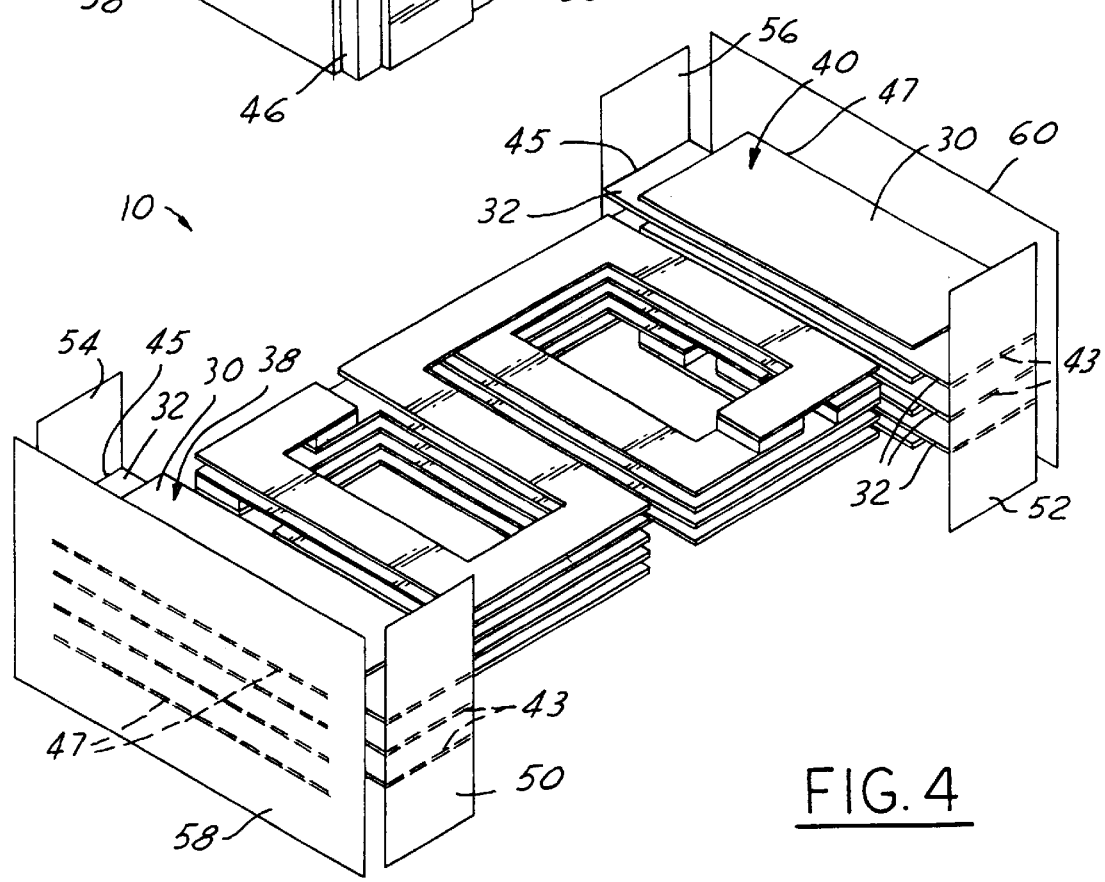
FIG. 4 is a perspective view of the π-type passive low pass filter with the dielectric encapsulant removed to show internal detail.

Referring to FIGS. 3 and 4, the passive low pass filter 10 is shown as constructed wherein the dielectric encapsulant 36 substantially forms a front surface 42, a back surface 44, a first end surface 46 and a second end surface 48. Each ground plate 32 extends further forward and backward than the hot plate 30. A front edge 43 and a back edge 45 of each ground plate 32, and not the hot plate 30, are thereby exposed through the front surface 42 and the back surface 44, respectively. Each hot plate 30 extends further outward from their respective capacitors 38, 40 than the ground plate 32. An exterior edge 47 of each hot plate 30 of the first and second capacitors 38, 40, and not the ground plate 32, thereby expose through the first and second end surfaces 46, 48, respectively.

First and second front conductor plates 50, 52 are adjacent to the front surface 42 and engage the front edges 43 of the ground plates 32 of the first and second capacitors 38, 40, respectively. First and second back conductor plates 54, 56 are adjacent to the back surface 44 and engage the back edges 45 of the ground plates 32 of the first and second capacitors 38, 40, respectively. First and second end conductor plates 58, 60 are adjacent to the first and second end surfaces 46, 48, respectively, and engage the exterior edges 47 of the hot plates 30 of the first and second capacitors 38, 40, respectively. The coils 12, 14 produce a magnetic field substantially parallel to the external ground conductor plates 50, 52, 54, and 56 as well as the external first and second end conductor plates 58, 60. The orientation of the coils 12, 14 eliminates the problem of field induced eddy currents in conductor plates 50, 52, 54, 56, 58, and 60.

Figure 5:
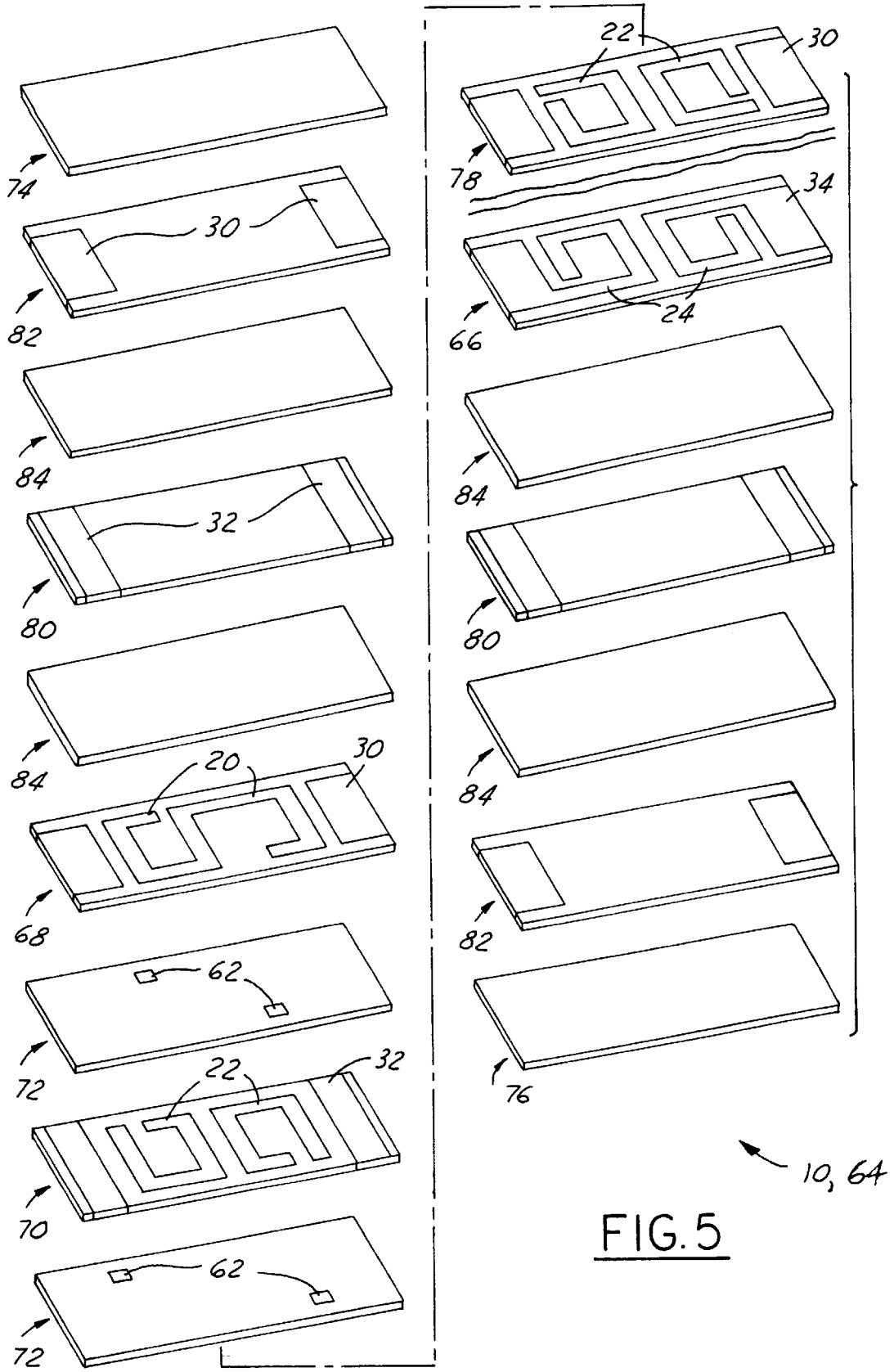
FIG. 5 is an exploded perspective view of the π-type passive low pass filter without the surface conductor plates.

Referring to FIGS. 1 and 5, the top, intermediate and bottom windings 20, 22, 24 of each coil 12, 14 are preferably parallel to the hot and ground plates 30, 32 of each capacitor 38, 40. Each top, intermediate and bottom winding 20, 22, 24 interconnect by a via 62. The parallel orientation of the top, intermediate and bottom windings 20, 22, 24 to the hot and ground plates 30, 32 conform to a layered fabrication of the passive low pass filter 10. The dielectric encapsulant 36 therefore comprises a plurality of layers 64 having a bottom combination layer 66 containing the feed plates 34 of the first and second capacitors 38, 40 and the bottom windings 24 of the first and second coils 12, 14. A top combination layer 68 is above the bottom combination layer 66 and contains the top windings 20 and one of the plurality of hot plates 30 from each capacitor 38, 40. At least one, and preferably a plurality of ground combination layers 70 are between the bottom and top combination layers 66, 68. The ground combination layer 70 contains one of the intermediate windings 22 from each coil 12, 14 and one of the ground plates 32 from each capacitor 38, 40. If only one ground combination layer 70 exists, then two of a plurality of via layers 72 separate the ground plate 32 from the hot plates 30, the top winding 20 from the intermediate winding 22 and the intermediate winding 22 from the bottom winding 24. Each of the plurality of via layers 72 contain two vias 62, one for each coil 12, 14. The vias 62 interconnect electrically the top, intermediate and bottom windings 20, 22, 24 and stagger circumferentially about their respective centerlines 16, 18 so as not to short circuit the top, intermediate and bottom windings 20, 22, 24. Above the top combination layer 68 is a homogeneous upper layer 74 and below the bottom combination layer is a homogeneous lower layer 76, both layers generally contain only the dielectric encapsulant 36.

To increase capacitance of the capacitors 38, 40 and the inductance of the coils 12, 14 preferably one, and at least one, intermediate hot combination layer 78 is between the bottom and top combination layers 66, 68. Each intermediate hot combination layer 78 contains one intermediate winding 22 from each coil 12, 14 and one hot plate 30 from each capacitor 38, 40. With the use of one intermediate hot combination layer 78, two ground combination layers 70 and four via layers 72 comprise in part the layers 64. The intermediate hot combination layer 78 is between the two ground combination layers 70. The four via layers separate the top and bottom combination layers 68, 66 from the ground combination layers 70, and separate the ground combination layers 70 from the intermediate hot combination layer 78.

To increase the capacitance of the capacitor 38, 40 without increasing the inductance of coils 12, 14 alternating ground and hot plate layers 80, 82 can be added above the top combination layer 68, or below the bottom combination layer 66, or both. The ground plate layer 80 contains a ground plate 32 from each capacitor 38, 40. The hot plate layer 82 contains a hot plate 30 from each capacitor 38, 40. If the ground and hot plate layers 80, 82 are above the top combination layer 68, each ground and hot plate layer 80, 82 engages one of a plurality of homogeneous layers 84 from below. If the ground and hot plate layers 80, 82 are below the bottom combination layer 66, each ground and hot plate layer 80, 82 engages one of the plurality of homogeneous layers 84 from above. The homogeneous layers 84 are substantially the same thickness as the via layers 72. The capping top and bottom homogeneous layers 74, 76 may be of greater thickness than the homogeneous and via layers 84, 72.

Figure 6:
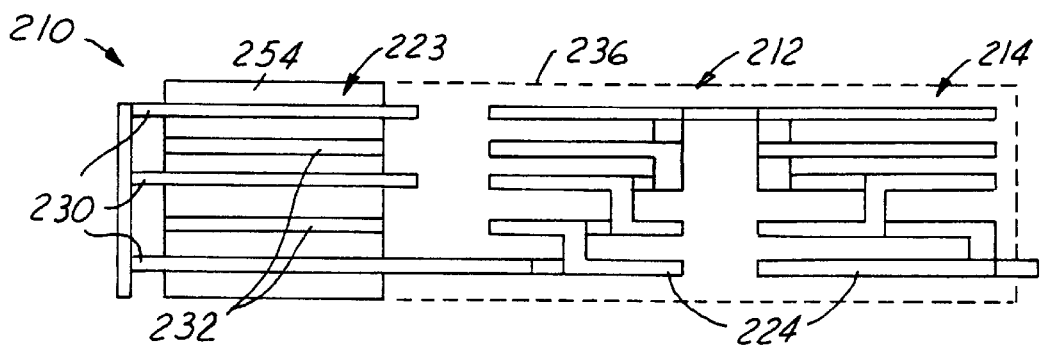
FIG. 6 is a front view of a second embodiment of the passive low pass filter with the dielectric encapsulant and the front surface conductor plate removed to show internal detail.

Referring to FIG. 6, a second preferred embodiment is shown in accordance with the invention. All numbering correlates to the first embodiment with the addition of the numeral two as a prefix. The second embodiment is a new form of a LC-type passive low pass filter 210 utilizing counter-wound coils 212, 214. The capacitor 228 of the LC-type passive low pass filter 210 comprises of a single capacitor 238, not two as in the π-type. The configuration, however, is essentially the same minus the second capacitor 40. For the LC-type, the bottom winding 224 of the second coil 214 is directly connected to the external circuit. The plate size of the capacitor 238 is equivalent to the combined size of the first and second capacitors 38, 40 of the π-type in order to achieve the same capacitance.

Figure 7:
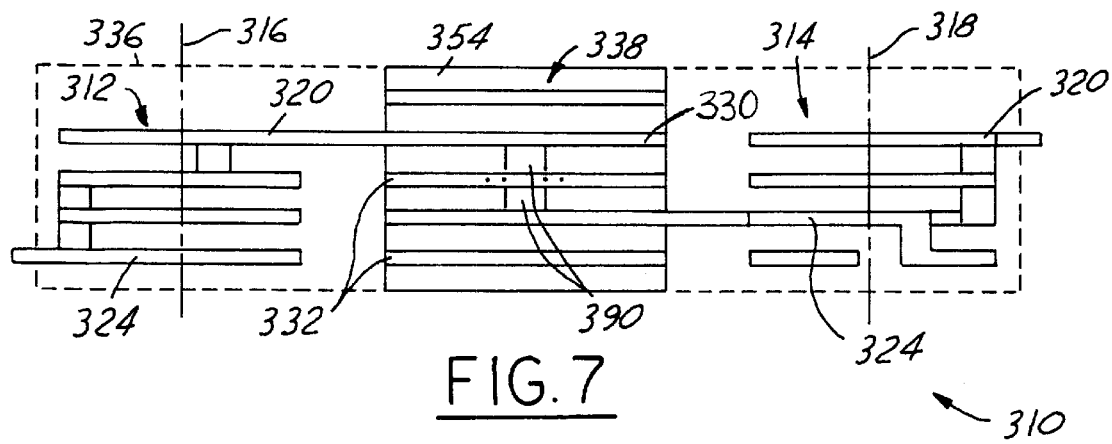
FIG. 7 is a front view of a third embodiment of the passive low pass filter with the dielectric encapsulant and the front surface conductor plate removed to show internal detail.

Referring to FIG. 7, a third preferred embodiment is shown in accordance with the invention. All numbering correlates to the first embodiment with the addition of the numeral three as a prefix. The third embodiment is a new form of a T-type passive low pass filter 310 utilizing counter-wound coils 312, 314. Like the LC-type, the T-type uses one capacitor 328. For the T-type, the single capacitor 328 centers between the coils 312 and 314. The ground plates 332 interconnect electrically like the π-type utilizing a front conductor plate 350 and a back conductor plate 354, however, the dielectric encapsulant 336 completely encases the hot plates 330. The hot plates 330 interconnect utilizing hot plate vias 390. The hot plate vias 390 are generally vertical, parallel to the centerlines 316, 318, and penetrate through the ground combination layer 370 substantially at the centers of the ground plates 332. Although the vias penetrate the ground plates 332 they do not make electrical contact with the ground plates but are separated by the presence of the dielectric encapsulant 336. The top winding 320 of the first coil 312 engages to one of the hot plates 330, and the bottom winding 324 of the first coil 312 engages to the external circuit. The bottom winding 324 of the second coil 314 engages to the feed plate 334, and the top winding 320 of the second coil 314 engages to the external circuit.

Although the preferred embodiments of the present invention have been disclosed, various changes and modifications may be made thereto by one skilled in the art without departing from the scope and spirit of the invention as set forth in the appended claims. It is also understood that the terms used herein are merely descriptive, rather than limiting, and that various changes may be made without departing from the scope and spirit of the invention.

I claim:

1. A passive low pass filter of a surface mount device configuration comprising:

a first coil having a top winding, a bottom winding, and a first centerline, the first coil wound about the first centerline;

a second coil having a top winding, a bottom winding, and a second centerline, the second coil wound about the second centerline, the first centerline parallel to the second centerline, the top winding of the first coil attached to the top winding of the second coil, the first coil being counter-wound with respect to the second coil;

at least one capacitor disposed adjacent to the first or second coil, each capacitor having a plurality of hot plates and at least one ground plate, the plurality of hot plates and the at least one ground plate stacked alternately and disposed perpendicular to the first and second centerlines, the plurality of hot plates having a feed plate, the bottom windings contacted electrically with the feed plate, wherein the at least one capacitor comprises a first capacitor, the first coil disposed between the first capacitor and the second coil, and a second capacitor, the second coil disposed between the second capacitor and the first coil, the bottom windings of the first and second coils connected to the feed plates of the first and second capacitors, respectively; and a dielectric encapsulant encasing the first and second coils and each one of the at least one ground plate and each one of the plurality of hot plates of the at least one capacitor, each one of the at least one ground plate and each one of the plurality of hot plates being exposed through the dielectric encapsulant, the ground plates being interconnected via a ground conductor plate, and the hot plates being interconnected via a hot conductor plate;

wherein the first and second coils each having at least one intermediate winding and a plurality of vias, the intermediate winding disposed between the top and bottom windings, the vias engaged electrically between the top, intermediate and bottom windings, each successive via offset circumferentially about the centerline so as not to short circuit the windings, each top, bottom and intermediate winding coplanar with one of the ground plates or one of the hot plates of the first and second capacitors, and;

the dielectric encapsulant having a plurality of layers perpendicular to the first and second centerlines, the plurality of layers having:

a bottom combination layer containing the feed plates of the first and second capacitors and the bottom windings of the first and second coils, the feed plate of the fist capacitor contacting the bottom winding of the first coil, the feed plate of the second capacitor contacting the bottom winding of the second coil, a top combination layer having the top winding of the first coil, the top winding of the second coil, one of the hot plates of the first capacitor and one of the hot plates of the second capacitor, at least one ground combination layer each having one of the intermediate windings of the first coil, one of the intermediate windings of the second coil, one of the ground plates of the first capacitor and one of the ground plates of the second capacitor, and a plurality of via layers each having one via of the first coil and one via of the second coil, the dielectric encapsulant of the via layers disposed between the hot plates and the ground plates.

2. A passive low pass filter as set forth in claim 1 wherein the plurality of layers has at least one intermediate hot combination layer each having one of the intermediate windings of the first coil, one of the intermediate windings of the second coil, one of the hot plates of the first capacitor and one of the hot plates of the second capacitor, and wherein the windings are spaced from the hot plates by the encapsulant.

3. A passive low filter as set forth in claim 2 wherein the plurality of layers has a homogeneous upper layer disposed above and engaged to the top combination layer, the homogeneous upper layer being dielectric encapsulant.

4. A passive low pass filter as set forth in claim 3 wherein the plurality of layers has a homogeneous lower layer disposed below and engaged to the bottom combination layer, the homogeneous lower layer being dielectric encapsulant.

5. A passive low pass filter at set forth in claim 6 wherein the plurality of layers further comprise:

at least one ground plate layer disposed above the homogeneous upper layer, one ground plate layer engaged to the homogeneous upper layer;

at least one hot plate layer disposed above the one ground plate layer engaged to the homogeneous upper layer, the at least one hot plate layers disposed alternately between the at least one ground plate layers; and a plurality of homogeneous layers engaged from above to each one of the at least one ground plate layers and each one of the at least one hot plate layers.

6. A passive low pass filter as set forth in claim 6 wherein the plurality of layers further comprise:

at least one ground plate layer disposed below the homogeneous lower layer, one ground plate layer engaged to the homogeneous lower layer;

at least one hot plate layer disposed below the one ground plate layer engaged to the homogeneous lower layer, the at least one hot plate layers disposed alternately between the at least one ground plate layers; and a plurality of homogeneous layers engaged from below to each one of the at least one ground plate layers and each one of the at least one hot plate layers.

7. A passive low pass filter as set forth in claim 5 or claim 6 wherein the plurality of homogeneous layers, the homogeneous upper layer, the homogeneous lower layer, and the via layers are of the same thickness.

8. A passive low filter as set forth in claim 7 wherein each one of the plurality of hot plates extends further away from the first and second coils than the at least one ground plate, and wherein each one of the at least one ground plates extend further backward and frontward than the plurality of hot plates.

9. A passive low pass filter as set forth in claim 8 further comprising the dielectric encapsulant having a front surface, a back surface, a first end surface, and a second end surface;

the at least one ground plate of the first and second capacitors each having a front edge and a back edge, the front and back edges exposed through the front and back surfaces, respectively; and the plurality of hot plates of the first and second capacitors each having an exterior edge, the exterior edges of the first and second capacitors exposed through the first and second end surfaces, respectively.

10. A passive low pass filter as set forth in claim 9 further comprising:

a first front conductor plate engaged to each front edge of the at least one ground plate of the first capacitor;

a second front conductor plate engaged to each front edge of the at least one ground plate of the second capacitor;

a first back conductor plate engaged to each back edge of the at least one ground plate of the first capacitor;

a second back conductor plate engaged to each back edge of the at least one ground plate of the second capacitor;

a first end conductor plate engaged to each exterior edge of the plurality of hot plates of the first capacitor; and a second end conductor plate engaged to each exterior edge of the plurality of hot plates of the second capacitor.

11. A passive low pass filter as set forth in claim 10 wherein the dielectric encapsulant is barium titanate.

* * * * *